US006452199B1

(12) United States Patent
Partlo et al.

(10) Patent No.: US 6,452,199 B1
(45) Date of Patent: *Sep. 17, 2002

(54) PLASMA FOCUS HIGH ENERGY PHOTON SOURCE WITH BLAST SHIELD

(75) Inventors: William N. Partlo, Poway; Igor V. Fomenkov, San Diego; Daniel L. Birx, Oakely, all of CA (US)

(73) Assignee: Cymer, Inc., San Diego, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/442,582

(22) Filed: Nov. 18, 1999

Related U.S. Application Data

(63) Continuation-in-part of application No. 09/324,526, filed on Jun. 2, 1999, which is a continuation-in-part of application No. 09/268,243, filed on Mar. 15, 1999, which is a continuation-in-part of application No. 09/093,416, filed on Jun. 8, 1998, which is a continuation-in-part of application No. 08/854,507, filed on May 12, 1997, now Pat. No. 5,763,930.

(51) Int. Cl.⁷ .......................... G21G 4/00; B23K 10/00
(52) U.S. Cl. .................. 250/504 R; 250/493.1
(58) Field of Search ............... 250/504, 493.1, 250/492.1, 504 R

(56) References Cited

U.S. PATENT DOCUMENTS

| | | | |
|---|---|---|---|
| 3,961,197 A | 6/1976 | Dawson | 250/493 |
| 3,969,628 A | 7/1976 | Roberts et al. | 250/402 |
| 4,042,848 A | 8/1977 | Lee et al. | 313/231.6 |
| 4,504,964 A | 3/1985 | Cartz et al. | 378/119 |
| 4,536,884 A | 8/1985 | Weiss et al. | 378/119 |
| 4,538,291 A | 8/1985 | Iwamatsu | 378/119 |
| 4,596,030 A | 6/1986 | Herziger et al. | 378/119 |
| 4,618,971 A | 10/1986 | Weiss et al. | 378/34 |
| 4,633,492 A | 12/1986 | Weiss et al. | 378/119 |
| 4,635,282 A | 1/1987 | Okada et al. | 378/34 |
| 4,751,723 A | 6/1988 | Gupta et al. | 378/119 |
| 4,837,794 A | 6/1989 | Riordan et al. | 378/119 |
| 5,023,897 A | 6/1991 | Neff et al. | 378/122 |
| 5,102,776 A | 4/1992 | Hammer et al. | 430/311 |
| 6,031,241 A * | 2/2000 | Silfvast et al. | 250/504 R |
| 6,172,324 B1 * | 1/2001 | Birx | 219/121.57 |

OTHER PUBLICATIONS

Partlo, William, et al., "EUV (13.5 nm) Light Generation Using a Dense Plasma Focus Device", SPIE Proc. on Emerging Lithographic Technologies III, vol. 3676, Mar. 1999, pp. 846–858.

Silfvastk, W. T., et al., "High–power plasma discharge source at 13.5 nm and 11.4 nm for EUB lithography",SPIE Proc. on Emerging Lithographic Technologies III, vol. 3676, Mar. 1999, pp. 272–275.

(List continued on next page.)

Primary Examiner—John R. Lee
Assistant Examiner—Anthony Quash
(74) Attorney, Agent, or Firm—John R. Ross

(57) ABSTRACT

A high energy photon source. A pair of plasma pinch electrodes are located in a vacuum chamber. The chamber contains a working gas which includes a noble buffer gas and an active gas chosen to provide a desired spectral line. A pulse power source provides electrical pulses at voltages high enough to create electrical discharges between the electrodes to produce very high temperature, high density plasma pinches in the working gas providing radiation at the spectral line of the active gas. A blast shield positioned just beyond the location of the high density pinch provides a physical barrier which confines the pinch limiting its axial elongation. A small port is provided in the blast shield that permits the radiation but not the plasma to pass through the shield. In a preferred embodiment a surface of the shield facing the plasma is dome-shaped.

39 Claims, 17 Drawing Sheets

OTHER PUBLICATIONS

Wu, Fushun, et al., "The Vacuum Spark and Spherical Pinch X–ray/EUV Point Sources", SPIE Proc. on Emerging Lithographic Technologies, III, vol. 3676, Mar. 1999, pp. 410–420.

Formenkov, Igor, et al., "Characterizationof a 13.5 nm Source for EUV Lithography based on a Dense Plasma Focus and Lithium Emission", Sematech International Workshop on EUV Lithography, Oct. 1999.

* cited by examiner

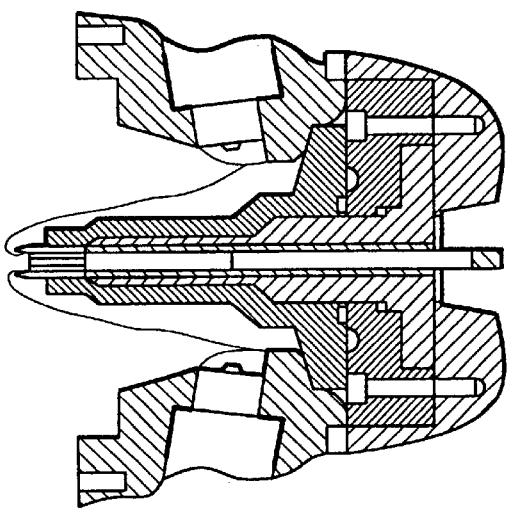
FIG. 5B-3  TIME= 0.6μS
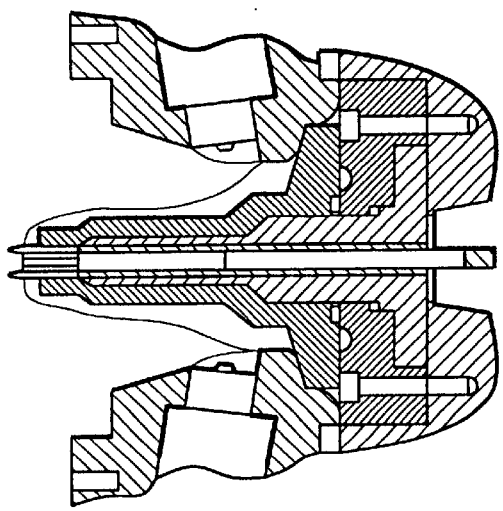
FIG. 5B-2  TIME= 0.3μS
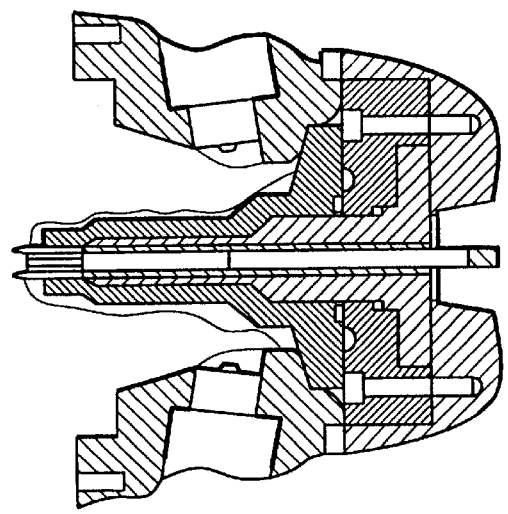
FIG. 5B-1  TIME= 0

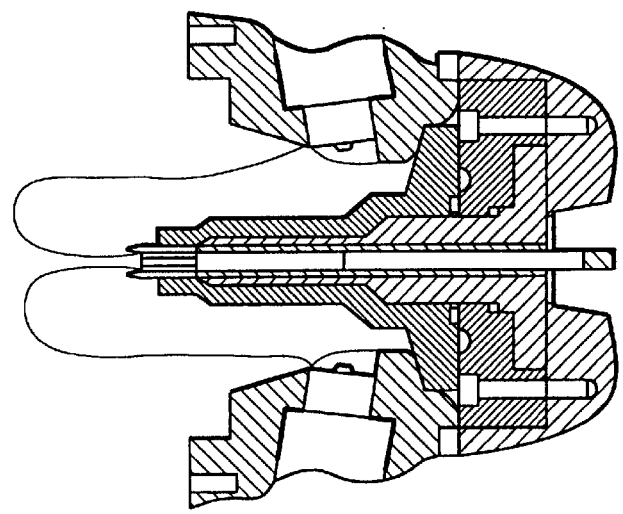
FIG.5B-6  TIME= 1.5µS
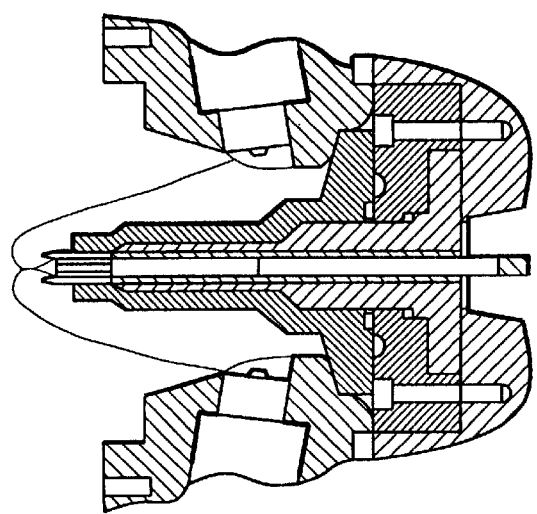
FIG.5B-5  TIME= 1.2µS
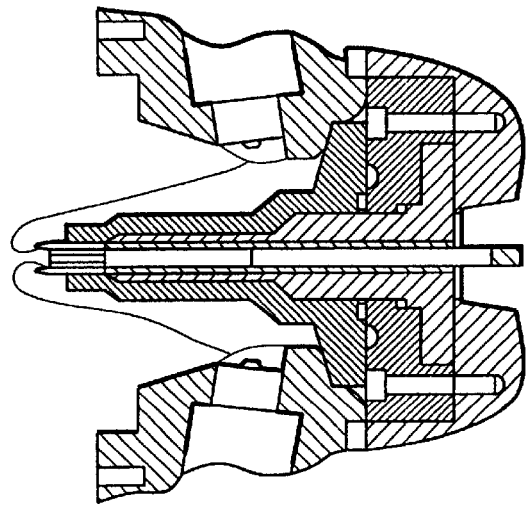
FIG.5B-4  TIME= 0.9µS

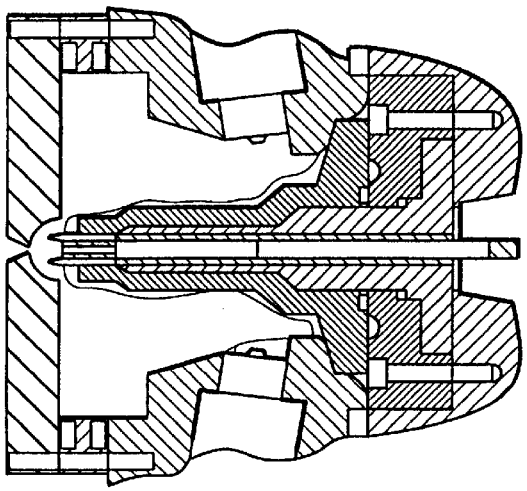
FIG.5C-3 TIME= 0.6μS
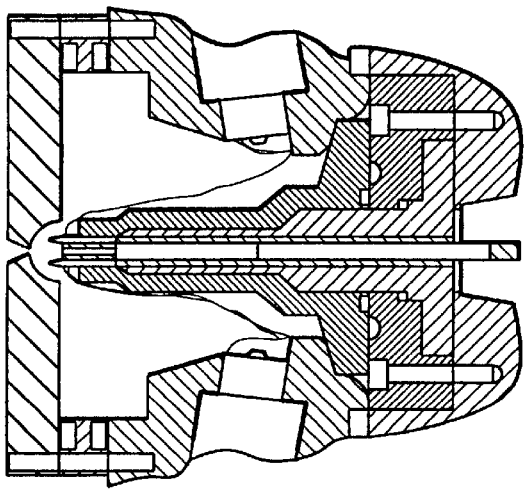
FIG.5C-2 TIME= 0.3μS
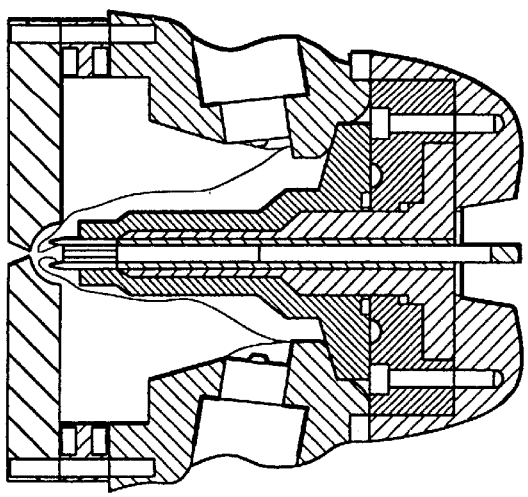
FIG.5C-1 TIME= 0

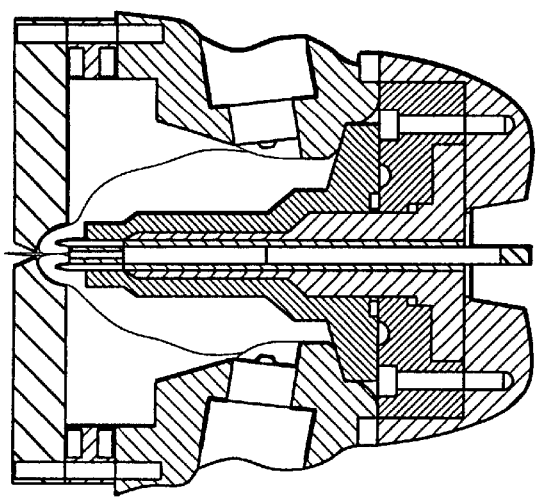
FIG.5C-6 TIME= 1.5μS
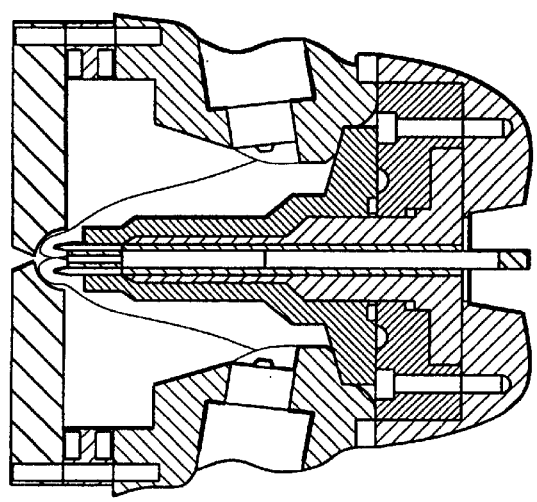
FIG.5C-5 TIME= 1.2μS
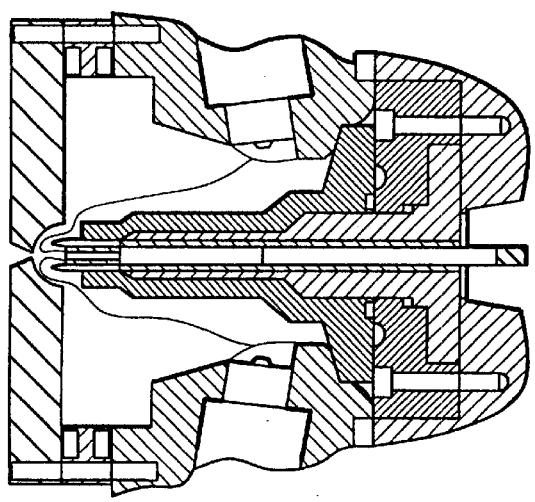
FIG.5C-4 TIME= 0.9μS

PLASMA FOCUS HIGH ENERGY PHOTON SOURCE WITH BLAST SHIELD

This application is a continuation-in-part of U.S. Ser. No. 09/324,526, filed Jun. 2, 1999 which was a continuation-in-part of U.S. Ser. No. 09/268,243 filed Mar. 15, 1999 and U.S. Ser. No. 09/093,416, filed Jun. 8, 1998 which was a CIP of Ser. No. 08/854,507 filed May 12, 1997 which is now U.S. Pat. No. 5,763,930. This invention relates to high energy photon sources and in particular highly reliable x-ray and high energy ultraviolet sources.

BACKGROUND OF THE INVENTION

The semiconductor industry continues to develop lithographic technologies which can print ever smaller integrated circuit dimensions. These systems must have high reliability, cost effective throughput, and reasonable process latitude. The integrated circuit fabrication industry is presently changing over from mercury G-line (436 nm) and I-line (365 nm) exposure sources to 248 nm and 193 nm excimer laser sources. This transition was precipitated by the need for higher lithographic resolution with minimum loss in depth-of-focus.

The demands of the integrated circuit industry will soon exceed the resolution capabilities of 193 nm exposure sources, thus creating a need for a reliable exposure source at a wavelength significantly shorter than 193 nm. An excimer line exists at 157 nm, but optical materials with sufficient transmission at this wavelength and sufficiently high optical quality are difficult to obtain. Therefore, all-reflective imaging systems may be required. An all reflective optical system requires a smaller numerical aperture than the transmissive systems. The loss in resolution caused by the smaller NA can only be made up by reducing the wavelength by a large factor. Thus, a light source in the range of 10 nm is required if the resolution of optical lithography is to be improved beyond that achieved with 193 nm or 157 nm.

The present state of the art in high energy ultraviolet and x-ray sources utilizes plasmas produced by bombarding various target materials with laser beams, electrons or other particles. Solid targets have been used, but the debris created by ablation of the solid target has detrimental effects on various components of a system intended for production line operation. A proposed solution to the debris problem is to use a frozen liquid or frozen gas target so that the debris will not plate out onto the optical equipment. However, none of these systems have proven to be practical for production line operation.

It has been well known for many years that x-rays and high energy ultraviolet radiation could be produced in a plasma pinch operation. In a plasma pinch an electric current is passed through a plasma in one of several possible configuration such that the magnetic field created by the flowing electric current accelerates the electrons and ions in the plasma into a tiny volume with sufficient energy to cause substantial stripping of outer electrons from the ions and a consequent production of x-rays and high energy ultraviolet radiation. Various prior art techniques for generation of high energy radiation from focusing or pinching plasmas are described in the following patents:

J. M. Dawson, "X-Ray Generator," U.S. Pat. No. 3,961,197, Jun. 1, 1976.

T. G. Roberts, et. al., "Intense, Energetic Electron Beam Assisted X-Ray Generator," U.S. Pat. No. 3,969,628, Jul. 13, 1976.

J. H. Lee, "Hypocycloidal Pinch Device," U.S. Pat. No. 4,042,848, Aug. 16, 1977.

L. Cartz, et. al., "Laser Beam Plasma Pinch X-Ray System," U.S. Pat. No. 4,504,964, Mar. 12, 1985.

A. Weiss, et. al., "Plasma Pinch X-Ray Apparatus," U.S. Pat. No. 4,536,884, Aug. 20, 1985.

S. Iwamatsu, "X-Ray Source," U.S. Pat. No. 4,538,291, Aug. 27, 1985.

G. Herziger and W. Neff, "Apparatus for Generating a Source of Plasma with High Radiation Intensity in the X-ray Region," U.S. Pat. No. 4,596,030, Jun. 17, 1986.

A. Weiss, et. al, "X-Ray Lithography System," U.S. Pat. No. 4,618,971, Oct. 21, 1986.

A. Weiss, et. al., "Plasma Pinch X-ray Method," U.S. Pat. No. 4,633,492, Dec. 30, 1986.

I. Okada, Y. Saitoh, "X-Ray Source and X-Ray Lithography Method," U.S. Pat. No. 4,635,282, Jan. 6, 1987.

R. P. Gupta, et. al., "Multiple Vacuum Arc Derived Plasma Pinch X-Ray Source," U.S. Pat. No. 4,751,723, Jun. 14, 1988.

R. P. Gupta, et. al., "Gas Discharge Derived Annular Plasma Pinch X-Ray Source," U.S. Pat. No. 4,752,946, Jun. 21, 1988.

J. C. Riordan, J. S. Peariman, "Filter Apparatus for use with an X-Ray Source," U.S. Pat. No. 4,837,794, Jun. 6, 1989.

W. Neff, et al., "Device for Generating X-radiation with a Plasma Source", U.S. Pat. No. 5,023,897, Jun. 11, 1991.

D. A. Hammer, D. H. Kalantar, "Method and Apparatus for Microlithography Using X-Pinch X-Ray Source," U.S. Pat. No. 5,102,776, Apr. 7, 1992.

M. W. McGeoch, "Plasma X-Ray Source," U.S. Pat. No. 5,504,795, Apr. 2, 1996.

G. Schriever, et al., "Laser-produced Lithium Plasma as a Narrow-band Extended Ultraviolet Radiation Source for Photoelectron Spectroscopy", Applied Optics, Vol. 37, No. 7, pp. 1243–1248, March 1998.

R. Lebert, et al., "A Gas Discharged Based Radiation Source for EUV Lithography", *Int. Conf. On Micro and Nano Engineering*, September, 1998.

W. Partlo, I. Fomenkov, D. Birx, "EUV (13.5 nm) Light Generation Using a Dense Plasma Focus Device", *SPIE Proc. On Emerging Lithographic Technologies III*, Vol. 3676, pp. 846–858, March 1999.

W. T. Silfast, et al., "High-power Plasma Discharge Source at 13.5 nm and 11.4 nm for EUV Lithography", *SPIE Proc. On Emerging Lithographic Technologies III*, Vol. 3676, pp. 272–275, March 1999.

F. Wu, et al., "The Vacuum Spark and Spherical Pinch X-ray/EUV Point Sources", *SPIE Proc. On Emerging Lithographic Technologies III*, Vol. 3676, pp. 410–420, March 1999.

I. Fomenkov, W. Partlo, D. Birx, "Characterization of a 13.5 nm for EUV Lithography based on a Dense Plasma Focus and Lithium Emission", *Sematech International Workshop on EUV Lithography*, October, 1999.

Typical prior art plasma focus devices can generate large amounts of radiation suitable for proximity x-ray lithography, but are limited in repetition rate due to large per pulse electrical energy requirements, and short lived internal components. The stored electrical energy requirements for these systems range from 1 kJ to 100 kJ. The repetition rates typically did not exceed a few pulses per second.

What is needed is a production line reliable, simple system for producing high energy ultraviolet and x-radiation which operates at high repetition rates and avoids prior art problems associated with debris formation.

SUMMARY OF THE INVENTION

The present invention provides a high energy photon source. A pair of plasma pinch electrodes are located in a vacuum chamber. The chamber contains a working gas which includes a noble buffer gas and an active gas chosen to provide a desired spectral line. A pulse power source provides electrical pulses at voltages high enough to create electrical discharges between the electrodes to produce very high temperature, high density plasma pinches in the working gas providing radiation at the spectral line of the active gas. A blast shield positioned just beyond the location of the high density pinch provides a physical barrier which confines the pinch limiting its axial elongation. A small port is provided in the blast shield that permits the radiation but not the plasma to pass through the shield. In a preferred embodiment a surface of the shield facing the plasma is dome-shaped.

In preferred embodiments an external reflection radiation collector-director collects radiation produced in the plasma pinch and directs the radiation in a desired direction. Also in preferred embodiments the active gas is lithium vapor and the buffer gas is helium and the radiation-collector is made of or coated with a material possessing high grazing incidence reflectivity. Good choices for the reflector material are molybdenum, palladium, ruthenium, rhodium, gold or tungsten.

In other preferred embodiments the buffer gas is argon and lithium gas is produced by vaporization of solid or liquid lithium located in a hole along the axis of the central electrode of a coaxial electrode configuration. In preferred embodiments, debris is collected on a conical nested debris collector having surfaces aligned with light rays extending out from the pinch site and directed toward the radiation collector-director. The conical nested debris collector and the radiation collector-director are maintained at a temperature in the range of about 400° C. which is above the melting point of lithium and substantially below the melting point of tungsten. Both tungsten and lithium vapor will collect on the debris collector but the lithium will evaporate off the debris collector and the collector-director whereas the tungsten will remain permanently on the debris collector and therefore does not collect on and degrade the reflectivity of the radiation collector-director. The reflection radiation collector-director and the conical nested debris collector could be fabricated together as one part or they could be separate parts aligned with each other and the pinch site.

A unique chamber window may be provided which is designed to transmit EUV light and reflect lower energy light including visible light. This window is preferably a small diameter window comprised of extremely thin material such as silicon, zercronium or beryllium.

Applicants describe herein a Dense Plasma Focus (DPF) prototype device constructed by Applicants and their fellow workers as a source for extreme ultraviolet (EUV) lithography employing an all-solid-state pulse power drive. Using the results from a vacuum grating spectrometer combined with measurements with a silicon photo diode, Applicants have found that substantial amounts of radiation within the reflectance band of Mo/Si mirrors can be generated using the 13.5 nm emission line of doubly ionized Lithium. This prototype DPF converts 25 J of stored electrical energy per pulse into approximately 0.76 J of in-band 13.5 nm radiation emitted into $4\pi$ steradians. The pulse repetition rate performance of this device has been investigated up to its DC power supply limit of 200 Hz. No significant reduction in EUV output per pulse was found up to this repetition rate. At 200 Hz, the measured pulse-to-pulse energy stability was $\sigma=6\%$ and no drop out pulses were observed. The electrical circuit and operation of this prototype DPF device is presented along with a description of several preferred modifications intended to improve stability, efficiency and performance.

The present invention provides a practical implementation of EUV lithography in a reliable, high brightness EUV light source with emission characteristics well matched to the reflection band of the Mo/Si or Mo/Be mirror systems. Since the proposed all-reflective EUV lithography tools are slit scanning based systems, the present invention provides EUV light source with high repetition rate capability.

BRIEF DESCRIPTION OF THE DRAWINGS

FIGS. 5B1–5B6 are drawings showing the buildup of the plasma pinch.

FIGS. 5C1–5C6 are drawings showing the buildup of the plasma pinch with the blast shield in place.

FIG. 6 is a pulse shape produced by the prototype unit.

DETAILED DESCRIPTION OF PREFERRED EMBODIMENTS

First Preferred Embodiment

Figure 1:
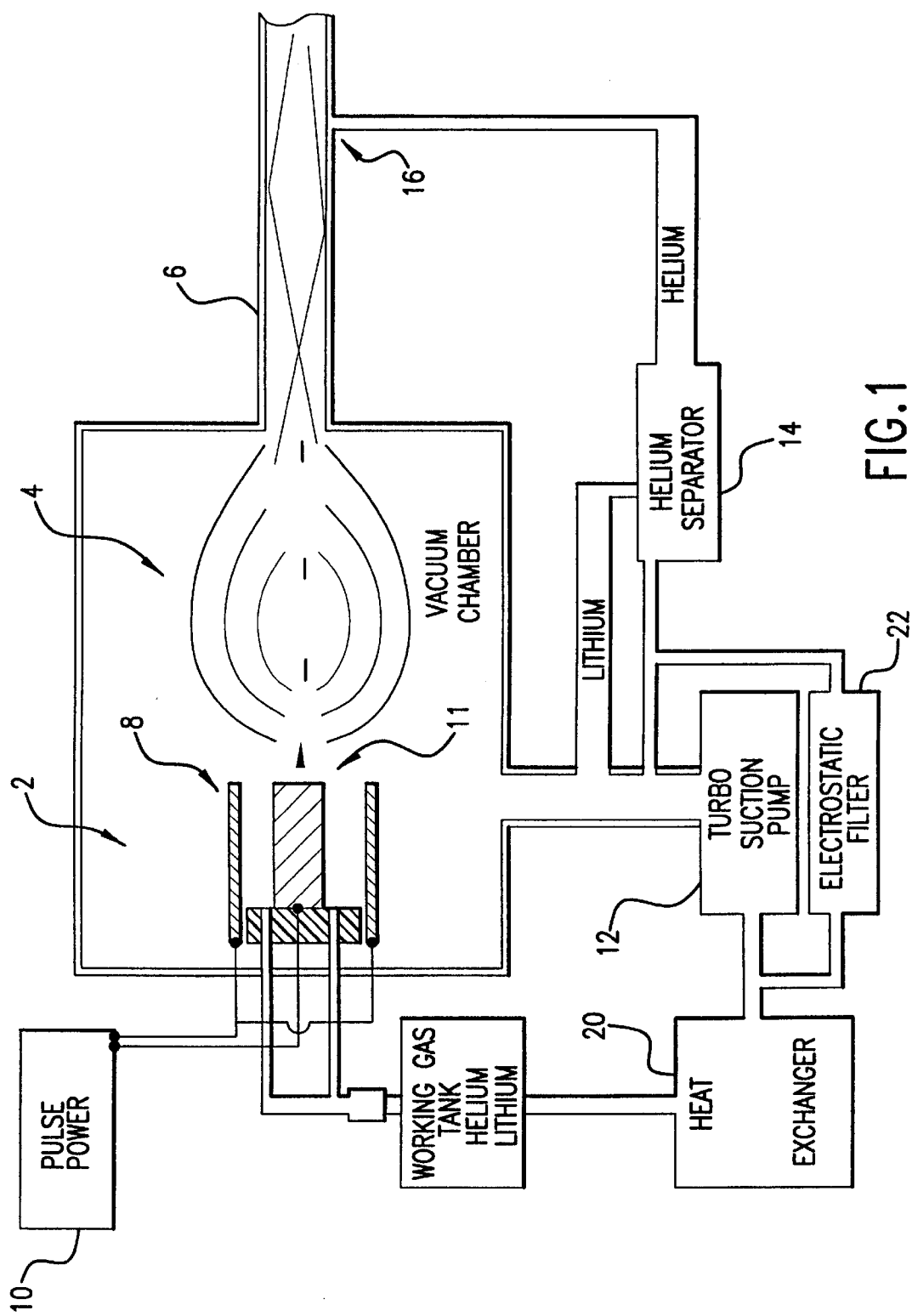
FIG. 1 is a drawing of a high energy photon source representing a preferred embodiment of the present invention.

A simplified drawing of a high energy ultraviolet light source is shown in FIG. 1. The major components are a plasma pinch unit 2, a high energy photon collector 4 and a hollow light pipe 6. The plasma pinch source comprises a coaxial electrode 8 powered by a low inductance pulse power circuit 10. The pulse power circuit in this preferred embodiment is a high voltage, energy efficient circuit capable of providing about 5 micro seconds pulses in the range of 1 kV to 2 kV to coaxial electrode 8 at a rate of 1,000 Hz.

A small amount of working gas, such as a mixture of helium and lithium vapor, is present near the base of the electrode 8 as shown in FIG. 1. At each high voltage pulse, avalanche breakdown occurs between the inner and outer electrodes of coaxial electrode 8 either due to preionization or self breakdown. The avalanche process occurring in the buffer gas ionizes the gas and creates a conducting plasma between the electrodes at the base of the electrodes. Once a conducting plasma exists, current flows between the inner and outer electrodes. In this preferred embodiment, the inner electrode is at high positive voltage and outer electrode is at ground potential. Current will flow from the inner electrode to the outer electrode and thus electrons will flow toward the center and positive ions will flow away from the center. This current flow generates a magnetic field which acts upon the moving charge carriers accelerating them away from the base of the coaxial electrode 8.

When the plasma reaches the end of the center electrode, the electrical and magnetic forces on the plasma, pinch the plasma to a "focus" around a point 10 along the centerline of and a short distance from the end of the central electrode and the pressure and temperature of the plasma rise rapidly reaching extremely high temperatures, in come cases much higher than the temperature at the surface of the sun! The dimensions of the electrodes and the total electrical energy in the circuit are preferably optimized to produce the desired black body temperature in the plasma. For the production of radiation in the 13 nm range a black body temperature of over 20–100 eV is required. In general, for a particular coaxial configuration, temperature will increase with increasing voltage of the electrical pulse. The shape of the radiation spot is somewhat irregular in the axial direction and roughly gausian in the radial direction. The typical radial dimension of the source is 300 microns and its length is approximately 4 mm.

In most prior art plasma pinch units described in the technical literature, the radiation spot emits radiation in all directions with a spectrum closely approximating a black body. The purpose of the lithium in the working gas is to narrow the spectrum of the radiation from the radiation spot.

Lithium Vapor

Doubly ionized lithium exhibits an electronic transition at 13.5 nm and serves as the radiation source atom in the buffer of helium. Doubly ionized lithium is an excellent choice for two reasons. The first is the low melting point and high vapor pressure of lithium. The lithium ejected from the radiation spot can be kept from plating out onto the chamber walls and collection optics by simply heating these surfaces above 180° C. The vapor phase lithium can then be pumped from the chamber along with the helium buffer gas using standard turbo-molecular pumping technology. And the lithium can be easily separated from the helium merely by cooling the two gases.

Figure 8:
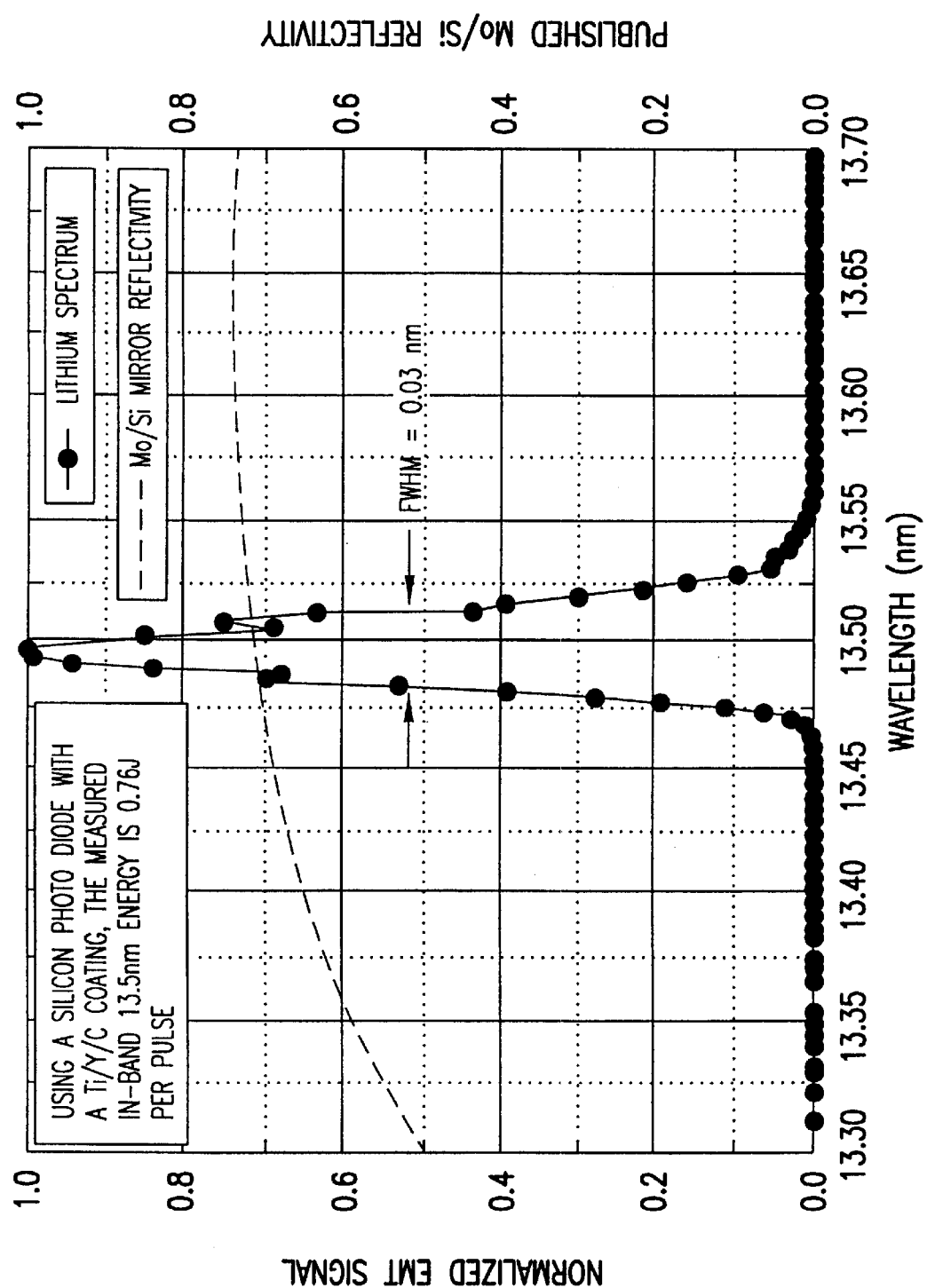
FIG. 8 shows the 13.5 nm lithium peak relative to reflectivity of MoSi coatings.

Coating materials are available for providing good reflection at 13.5 nm. FIG. 8 shows the lithium emission peak in relation to the published MoSi reflectivity.

A third advantage of using lithium as the source atom is that non-ionized lithium has a low absorption cross section for 13.5 nm radiation. Furthermore, any ionized lithium ejected from the radiation spot can be easily swept away with a moderate electric field. The remaining non-ionized lithium is substantially transparent to 13.5 nm radiation. The currently most popular proposed source in the range of 13 nm makes use of a laser ablated frozen jet of xenon. Such a system must capture virtually all of the ejected xenon before the next pulse because the absorption cross section for xenon at 13 nm is large.

Radiation Collector

The radiation produced at the radiation spot is emitted uniformly into a full $4\pi$ steradians. Some type of collection optics is needed to capture this radiation and direct it toward the lithography tool. Previously proposed 13 nm light sources suggested collection optics based on the use of multi-layer dielectric coated mirrors. The use of multi-layer dielectric mirrors is used to achieve high collection efficiency over a large angular range. Any radiation source which produced debris would coat these dielectric mirrors and degrade their reflectivity, and thus reduce the collected output from the source. This preferred system will suffer from electrode erosion and thus would, over time, degrade any dielectric mirror placed in proximity to the radiation spot.

Figure 11:
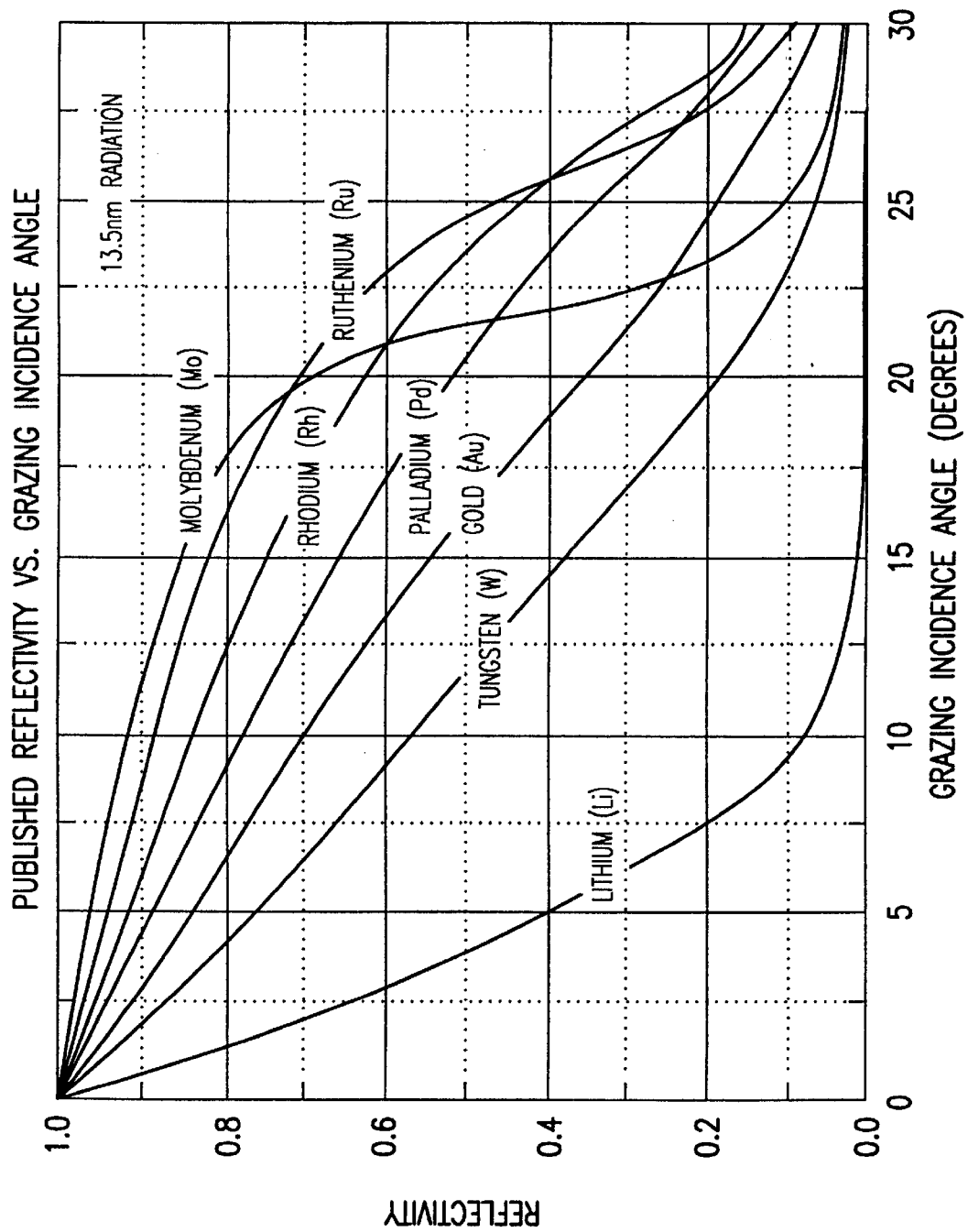
FIG. 11 is a chart showing reflectivity of various materials for 13.5 mn ultraviolet radiation.

Several materials are available with high reflectivity at small grazing incident angles for 13.5 nm UV light. Graphs for some of these are shown in FIG. 11. Good choices include molybdenum, rhodium and tungsten. The collector may be fabricated from these materials, but preferably they are applied as a coating on a substrate structural material such as nickel. This conic section can be prepared by electroplating nickel on a removable mandrel.

Figure 2:
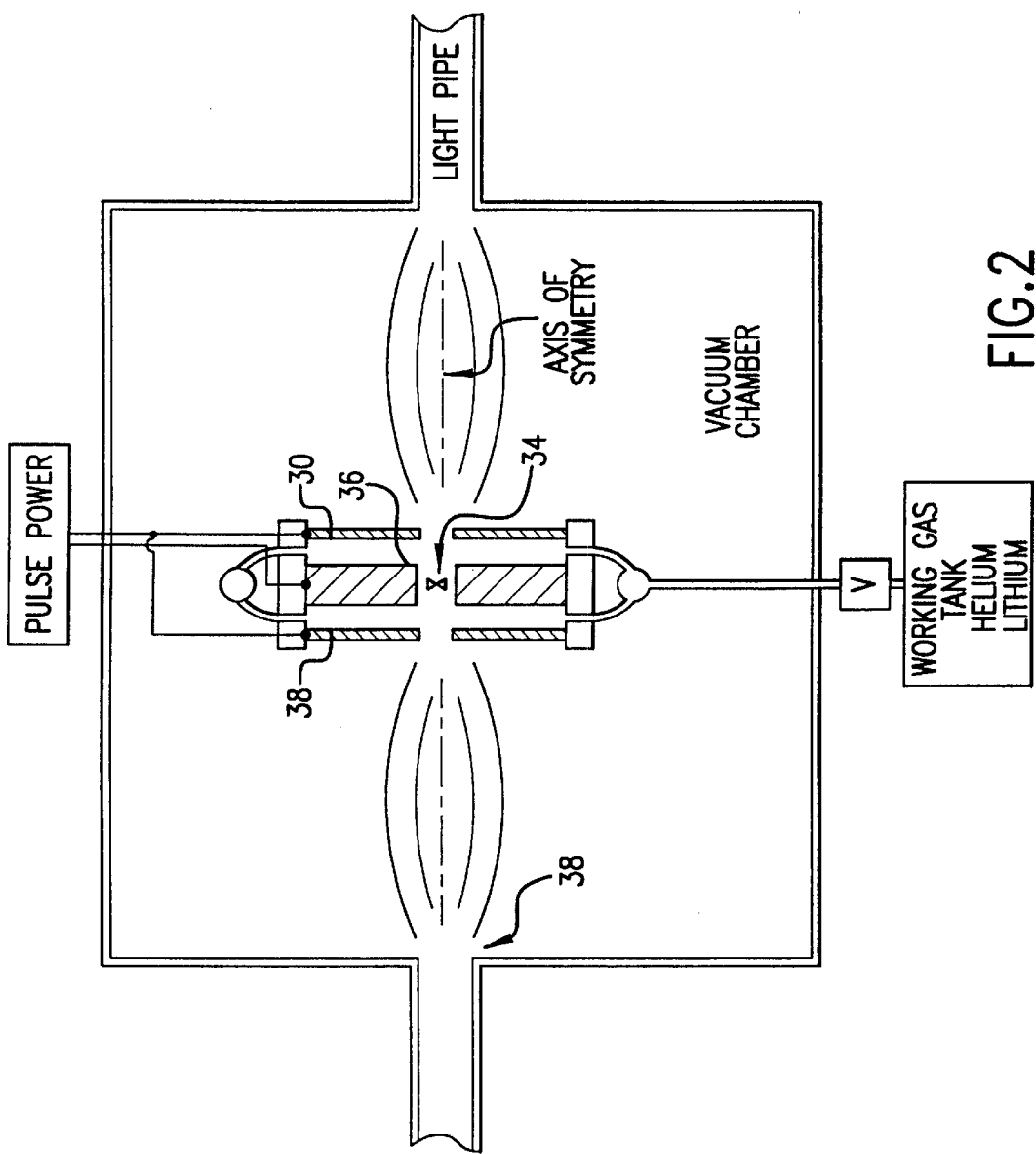
FIG. 2 is a drawing of a three dimensional plasma pinch device with disk shaped electrodes.
Figure 3:
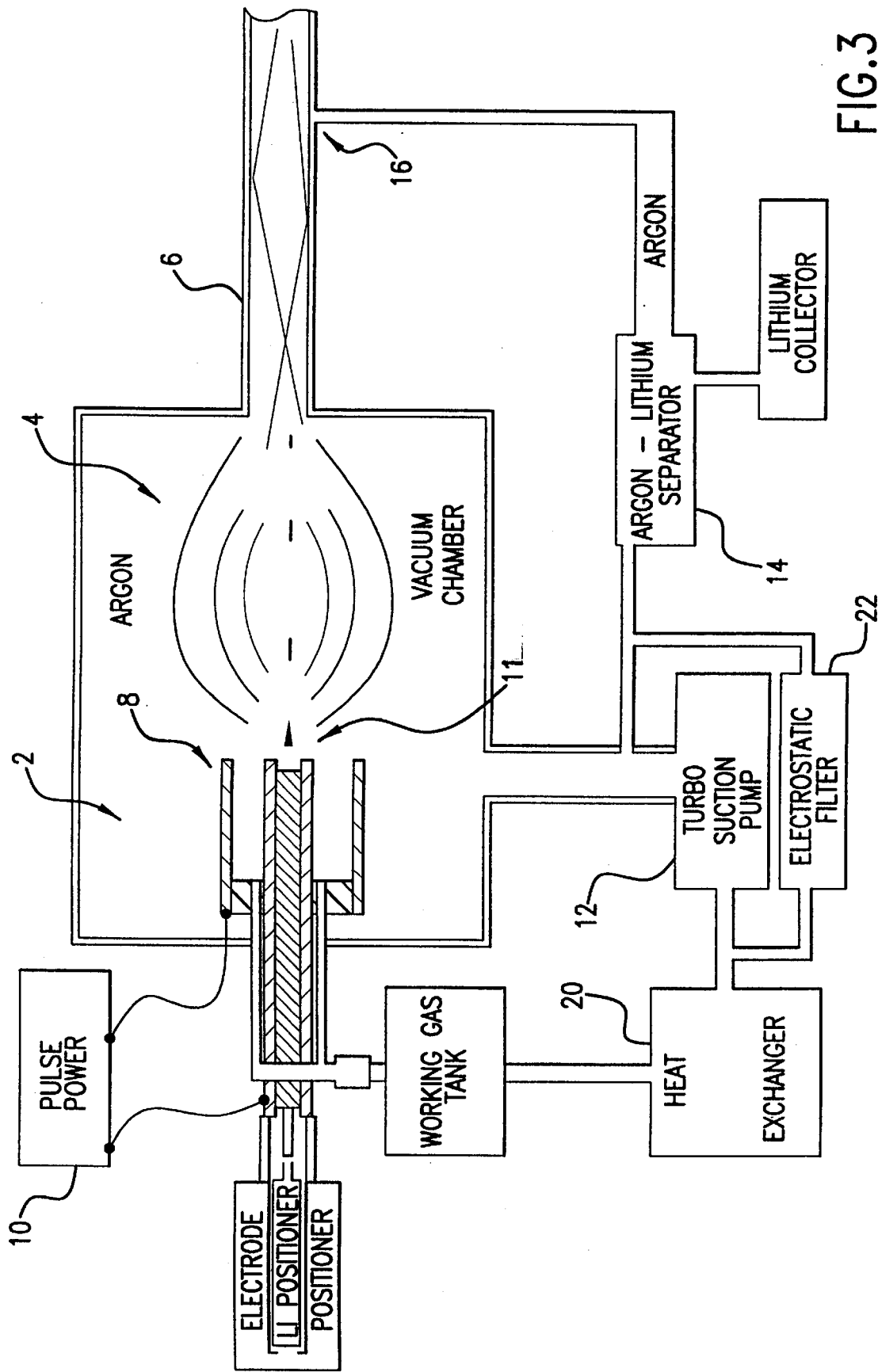
FIG. 3 is a drawing of a third preferred embodiment of the present invention.

To produce a collector capable of accepting a large cone angle, several conical sections can be nested inside each other. Each conical section may employ more than one reflection of the radiation to redirect its section of the radiation cone in the desired direction. Designing the collection for operation nearest to grazing incidence will produce a collector most tolerant to deposition of eroded electrode material. The grazing incidence reflectivity of mirrors such as this depends strongly on the mirror's surface roughness. The dependence on surface roughness decreases as the incident angle approaches grazing incidence. We estimate that we can collect and direct the 13 nm radiation being emitted over a solid angle of least 25 degrees. Preferred collectors for directing radiation into light pipes are shown in FIGS. 1, 2 and 3.

Tungsten Electrodes—Tungsten Coatings for Collector

A preferred method for choosing the material for the external reflection collector is that the coating material on the collector be the same as the electrode material. Tungsten is a promising candidate since it has demonstrated performance as an electrode and the real part of its refractive index at 13 nm is 0.945. Using the same material for the electrode and the mirror coating minimizes the degradation of mirror reflectivity as the eroded electrode material plates out onto the collection mirrors.

Silver Electrodes and Coatings

Silver is also an excellent choice for the electrodes and the coatings because it also has a low refractive index at 13 nm and has high thermal conductivity allowing higher repetition rate operation.

Conical Nested Debris Collector

Figure 9:
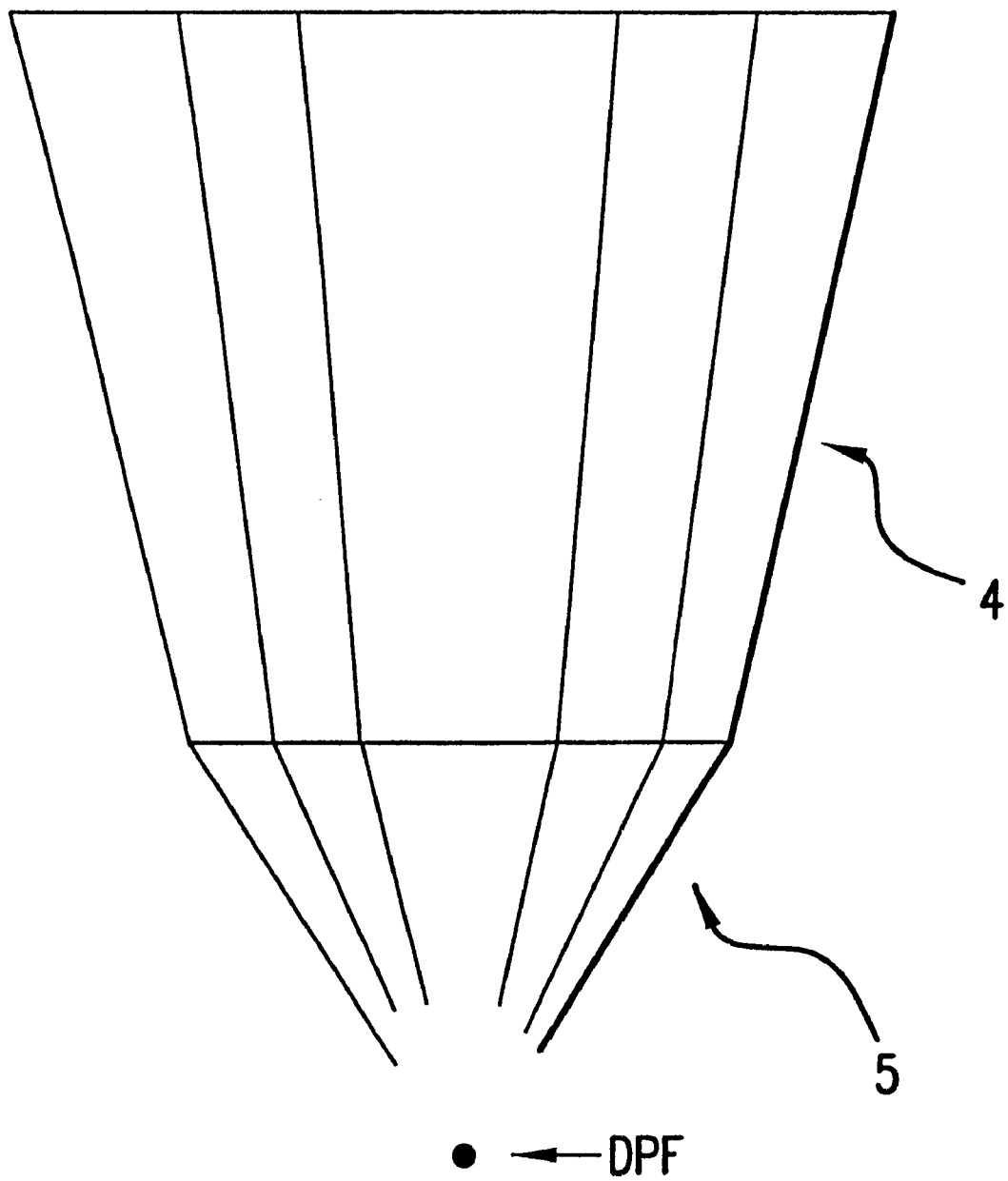
FIG. 9 shows a nested conical debris collector.

In another preferred embodiment the collector-director is protected from surface contamination with vaporized electrode material by a debris collector which collects all of the tungsten vapor before it can reach the collector director 5. FIG. 9 shows a conical nested debris collector 5 for collecting debris resulting from the plasma pinch. Debris collector 5 is comprised of nested conical sections having surfaces aligned with light rays extending out from the center of the pinch site and directed toward the collector-director 4.

The debris collected includes vaporized tungsten from the tungsten electrodes and vaporized lithium. The debris collector is attached to or is a part of radiation collector-director 4. Both collectors are comprised of nickel plated substrates. The radiation collector-director portion 4 is coated with molybdenum or rhodium for very high reflectivity. Preferably both collectors are heated to about 400° C. which is substantially above the melting point of lithium and substantially below the melting point of tungsten. The vapors of both lithium and tungsten will collect on the surfaces of the debris collector 5 but lithium will vaporize off and to the extent the lithium collects on collector-director 4, it will soon thereafter also vaporize off. The tungsten once collected on debris collector 5 will remain there permanently.

Figure 7:
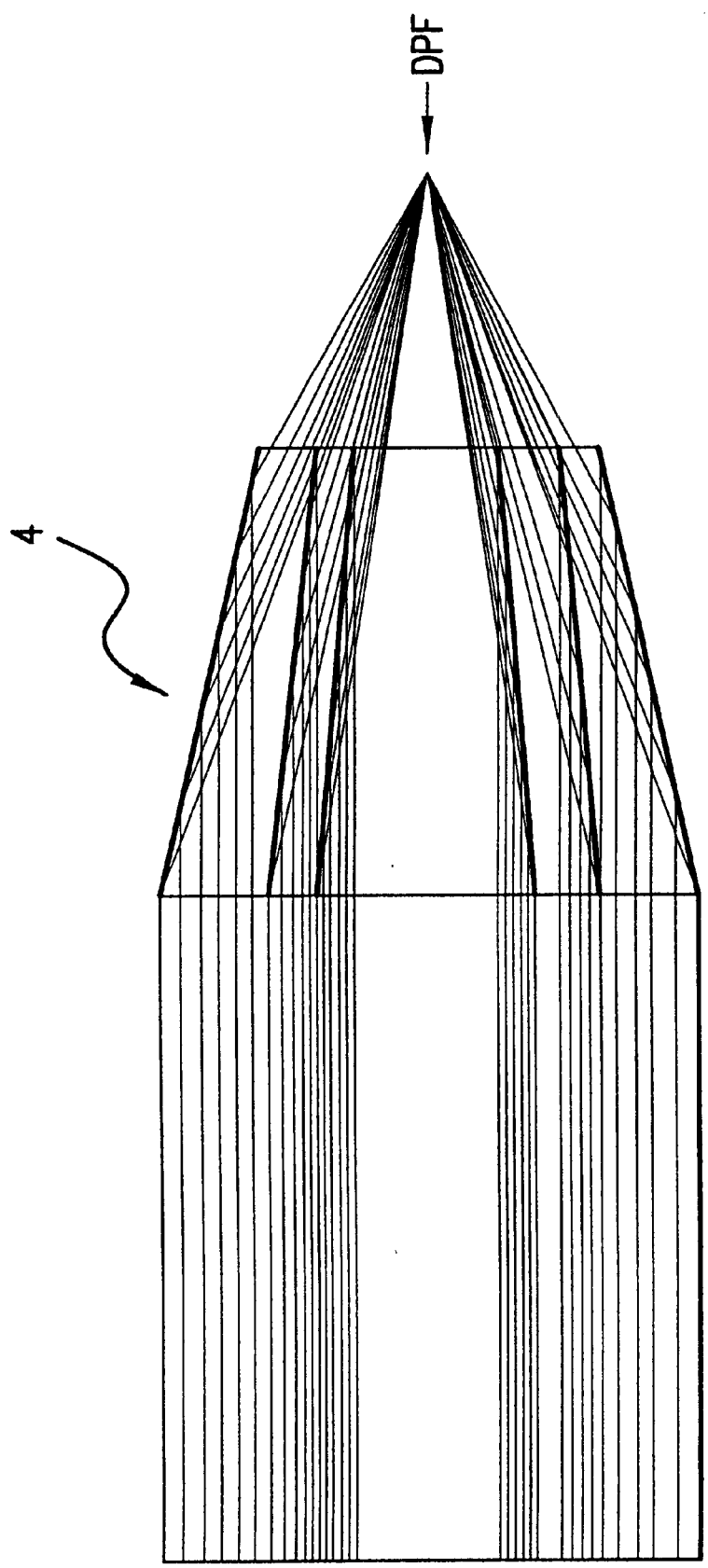
FIG. 7 shows a portion of the EUV beam produced by a hyprobolic collector.

FIG. 7 shows the optical features of a collector designed by Applicants. The collector is comprised of five nested grazing incident parabolic reflectors, but only three of the five reflections are shown in the drawing. The two inner reflectors are not shown. In this design the collection angle is about 0.4 steradians. As discussed below the collector surface is coated and is heated to prevent deposition of lithium. This design produces a parallel beam. Other preferred designs such as that shown in FIGS. 1, 3 and 10 would focus the beam. The collector should be coated with a material possessing high glazing incidence reflectivity in the 13.5 nm wavelength range. Two such materials are palladium and ruthenium.

Light Pipe

It is important to keep deposition materials away from the illumination optics of the lithography tool. Therefore, a light pipe 6 is preferred to further assure this separation. The lightpipe 6 is a hollow lightpipe which also employs substantially total external reflection on its inside surfaces. The primary collection optic can be designed to reduce the cone angle of the collected radiation to match the acceptance angle of the hollow lightpipe. This concept is shown in FIG. 1.

The dielectric mirrors of the lithography tool would then be very well protected from any electrode debris since a tungsten, silver or lithium atom would have to diffuse upstream against a flow of buffer gas down the hollow lightpipe as shown in FIG. 1.

Pulse Power Unit

The preferred pulse power unit 10 is a solid state high frequency, high voltage pulse power unit utilizing a solid state trigger and a magnetic switch circuit such as the pulse power units described in U.S. Pat. No. 5,142,166. These units are extremely reliable and can operate continuously without substantial maintenance for many months and billions of pulses. The teachings of U.S. Pat. No. 5,142,166 are incorporated herein by reference.

Figure 4:
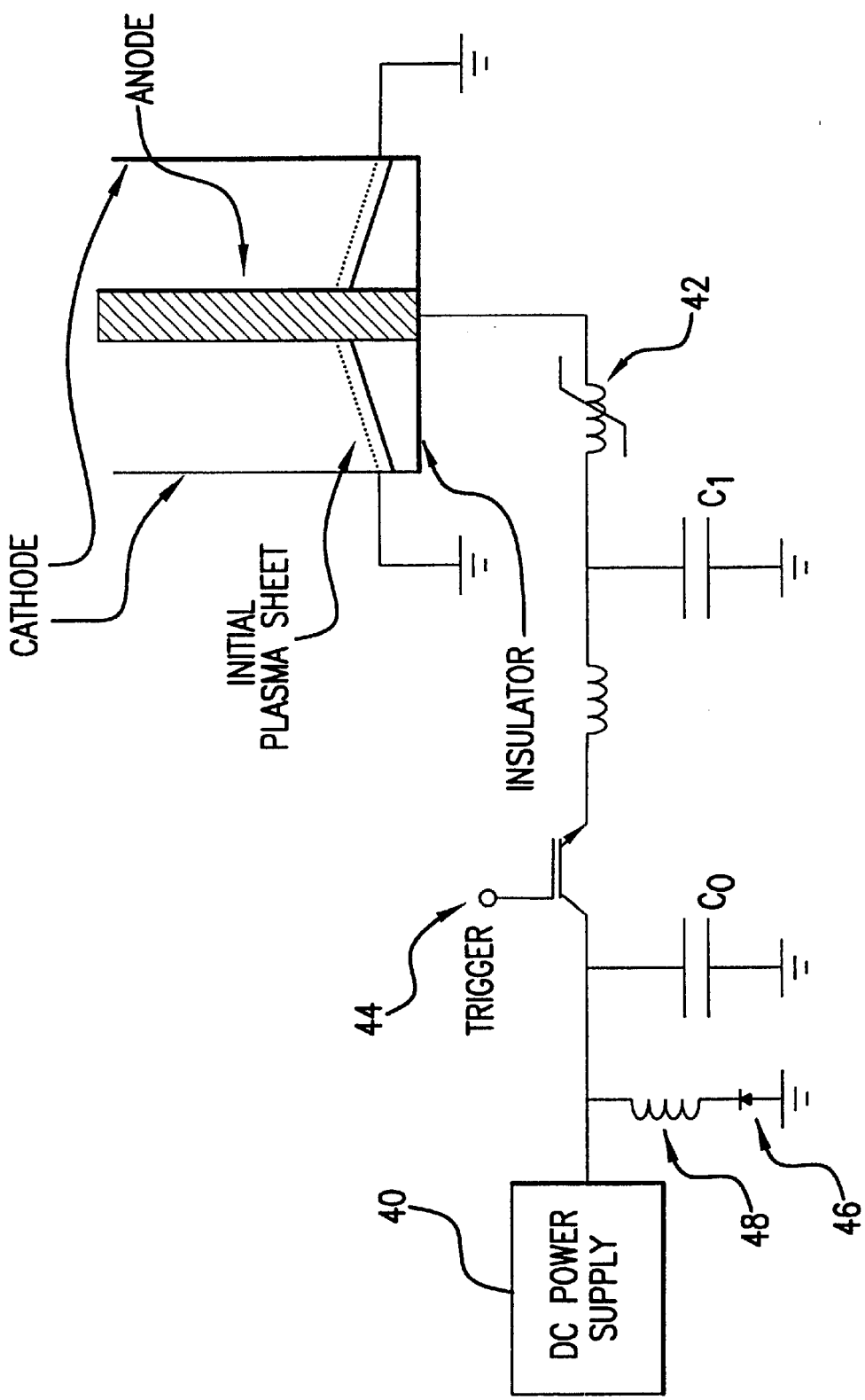
FIG. 4 is a preferred circuit diagram for a preferred embodiment of the present invention.

FIG. 4 shows a simplified electrical circuit providing pulse power. A preferred embodiment includes DC power supply 40 which is a command resonant charging supply of the type used in excimer lasers. $C_0$ which is a bank of off the shelf capacitors having a combined capacitance of 65 $\mu$F, a peaking capacitor $C_1$ which is also a bank of off the shelf capacitors having a combined capacitance of 65 $\mu$F. Saturable inductor 42 has a saturated drive inductance of about 1.5 nH. Trigger 44 is an IGBT. Diode 46 and inductor 48 creates an energy recovery circuit similar to that described in U.S. Pat. No. 5,729,562 permitting reflected electrical energy from one pulse to be stored on $C_0$ prior to the next pulse.

The System—First Preferred Embodiment

Thus, as shown in FIG. 1, in a first preferred embodiment, a working gas mixture of helium and lithium vapor is discharged into coaxial electrode 8. Electrical pulses from pulse power unit 10 create a dense plasma focus at 11 at sufficiently high temperatures and pressures to doubly ionize the lithium atoms in the working gas generating ultraviolet radiation at about 13.5 nm wavelength.

This light is collected in total external reflection-collector 4 and directed into hollow light pipe 6 where the light is further directed to a lithography tool (not shown). Discharge chamber 1 is maintained at a vacuum of about 4 Torr with turbo suction pump 12. Some of the helium in the working gas is separated in helium separator 14 and used to purge the lightpipe as shown in FIG. 1 at 16. The pressure of helium in the light pipe is preferably matched to the pressure requirements of the lithography tool which typically is maintained at a low pressure or vacuum. The temperature of the working gas is maintained at the desired temperature with heat exchanger 20 and the gas is cleaned with electrostatic filter 22. The gas is discharged into the coaxial electrode space as shown in FIG. 1.

Prototype Unit

A drawing of a prototype plasma pinch unit built and tested by Applicant and his fellow workers is shown in FIG. 5. Principal elements are $C_1$ capacitor decks, $C_0$ capacitor decks 1 GBT switches, saturable inductor 42, vacuum vessel 3, and coaxial electrode 8.

Test Results

Figure 5A:
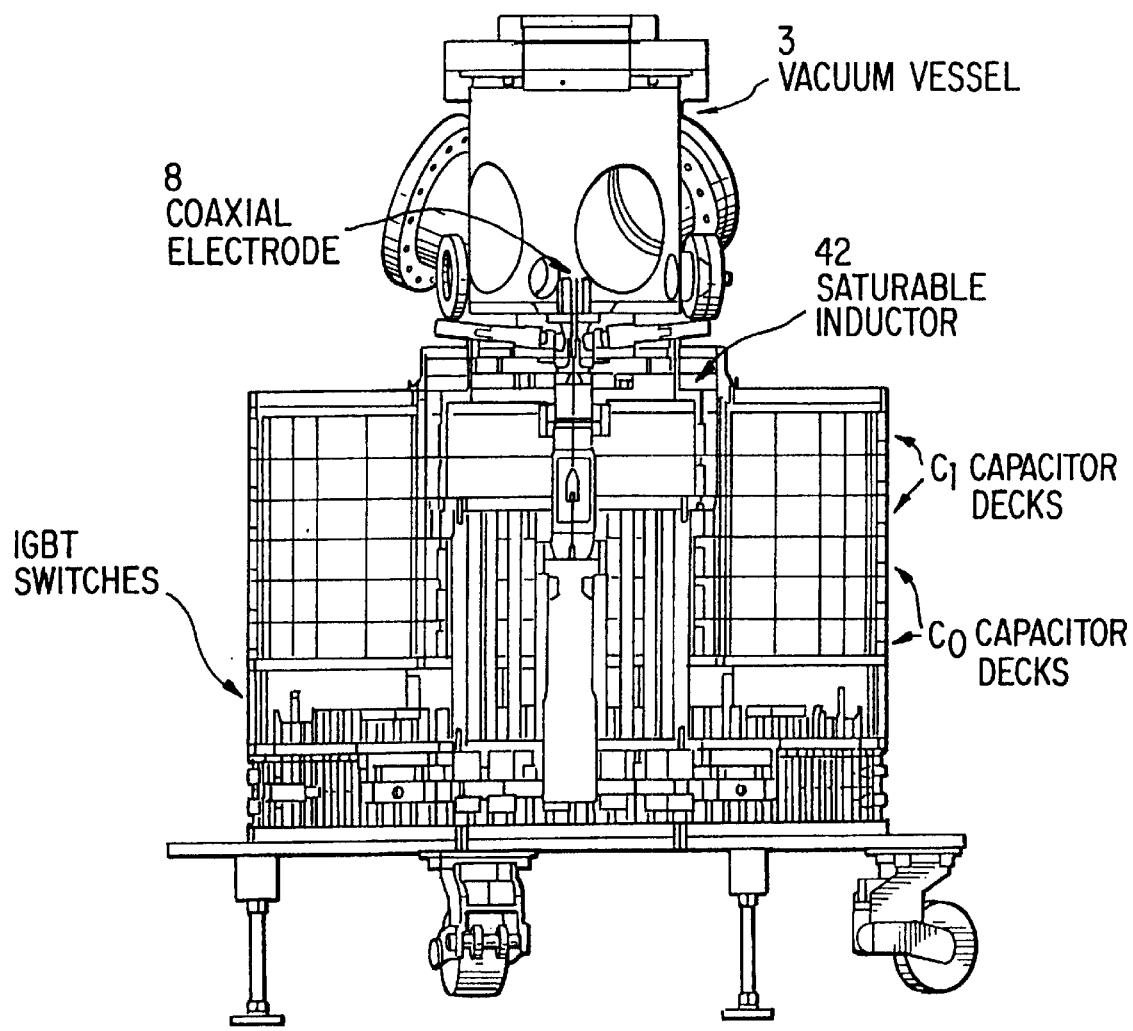
FIG. 5A is a drawing of a prototype unit built by Applicants and their fellow workers.
Figure 5B:
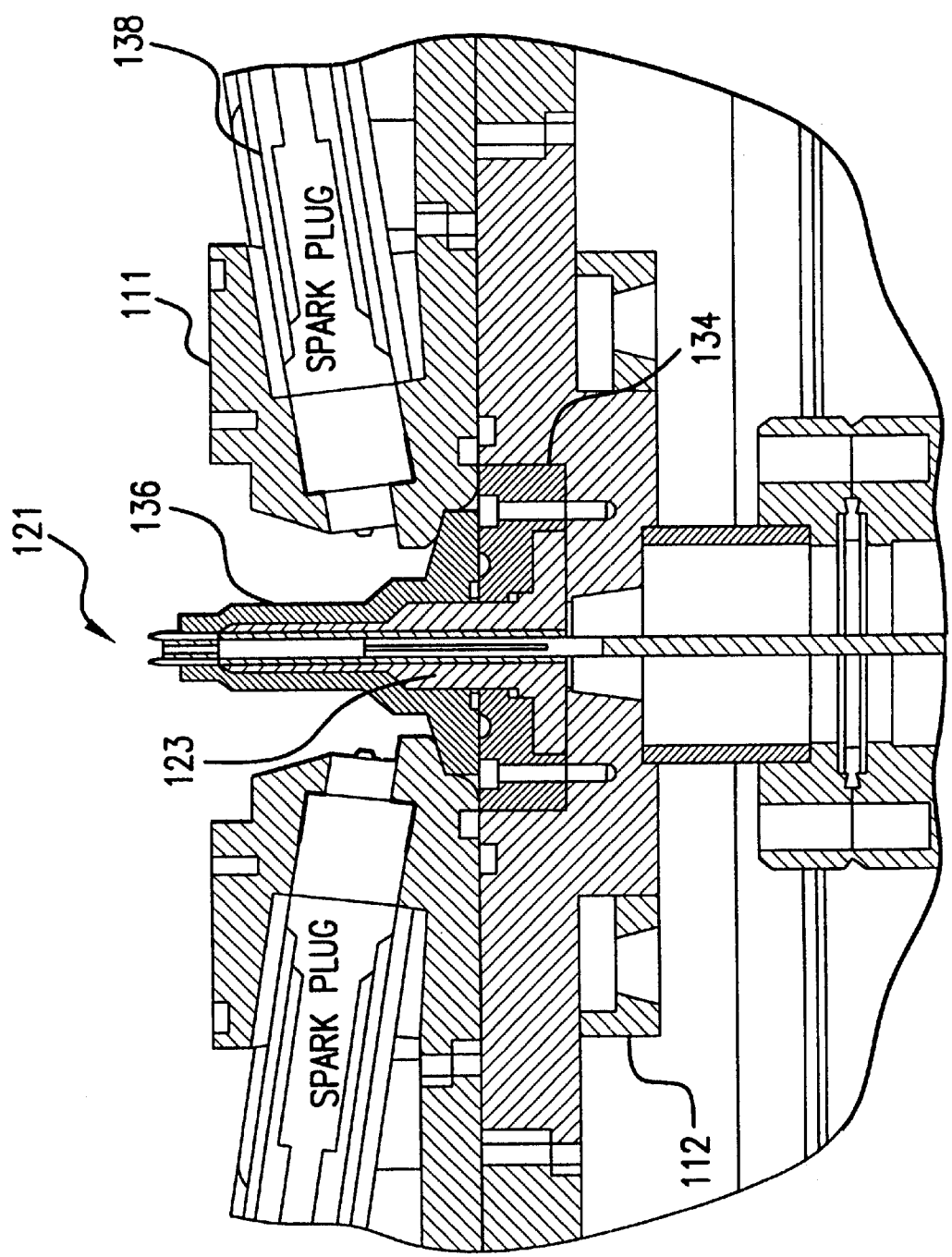
FIG. 5B is a cross section view showing the electrodes of the prototype with spark plug pre-ionizers.
Figure 5C:
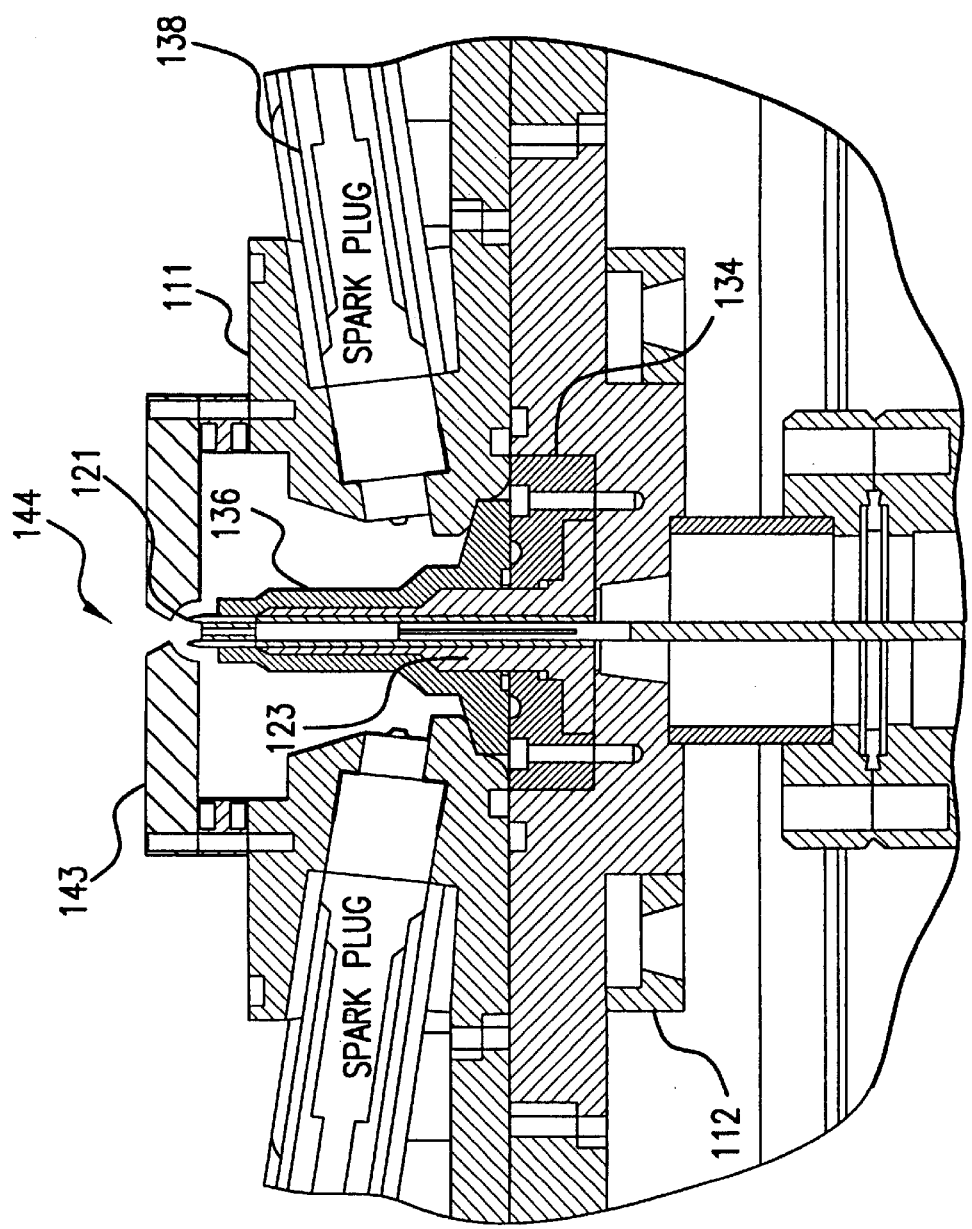
FIG. 5C shows a cross section of the electrode region with the addition of a blast shield.
Figure 6:
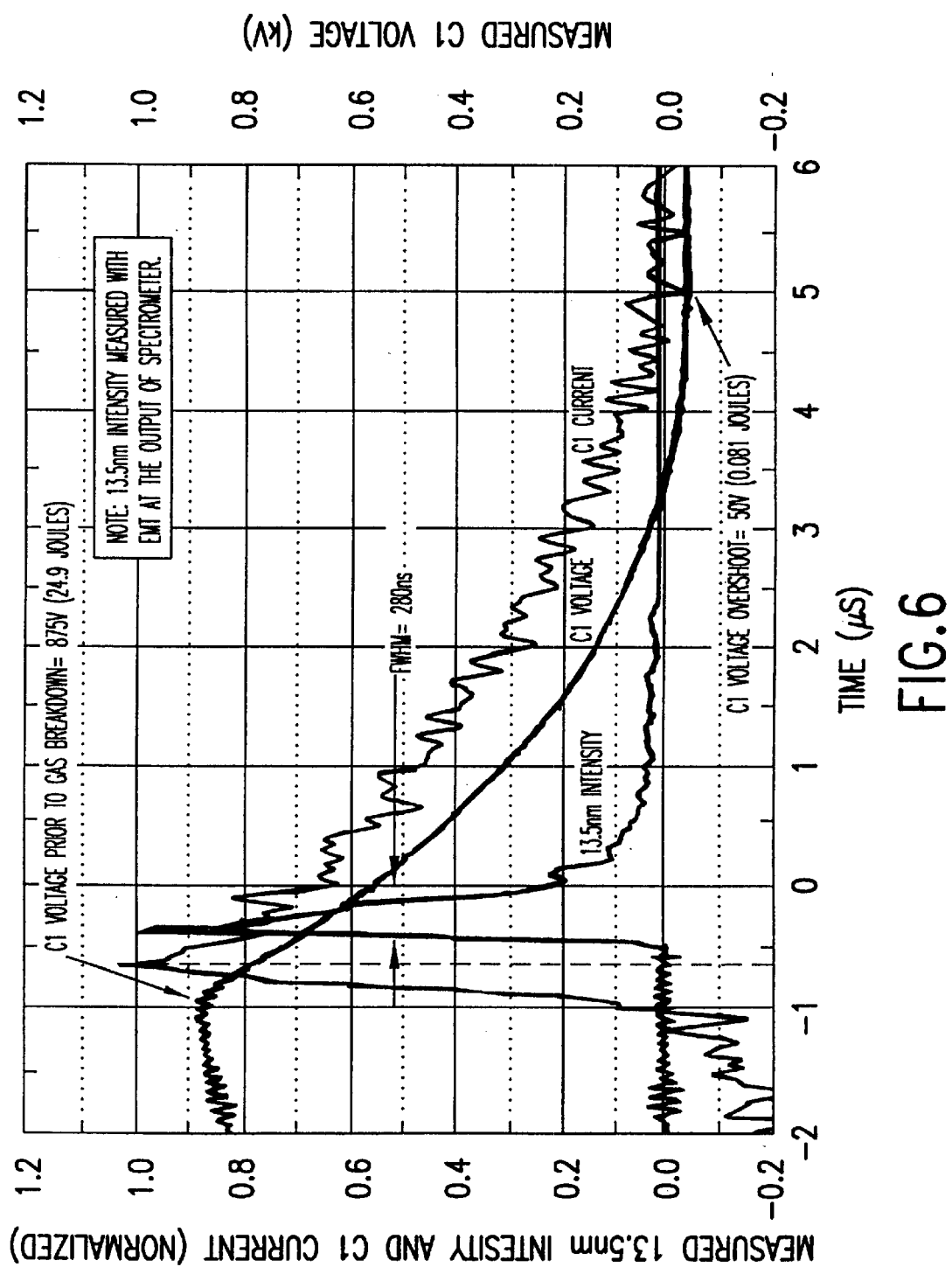

FIG. 6 shows a typical pulse shape measured by Applicant with the unit shown in FIG. 5. Applicants have recorded $C_1$ voltage, $C_1$ current and intensity at 13.5 nm over an 8 microsecond period. The integrated energy in this typical pulse is about 0.8 J. The pulse width (at FWHM) is about 280 ns. The $C_1$ voltage prior to breakdown is a little less than 1 KV.

This prototype embodiment can be operated at a pulse rate up to 200 Hz. The measured average in-band 13.5 nm radiation at 200 Hz is 152 W in $4\pi$ steradians. Energy stability at 1 sigma is about 6%. Applicants estimate that 3.2 percent of the energy can be directed into a useful 13.5 nm beam with the collector 4 shown in FIG. 1.

Second Preferred Plasma Pinch Unit

A second preferred plasma pinch unit is shown in FIG. 2. This unit is similar to the plasma pinch device described in U.S. Pat. No. 4,042,848. This unit comprises two outer disk shaped electrodes 30 and 32 and an inner disk shaped electrode 36. The pinch is created from three directions as described in U.S. Pat. No. 4,042,848 and as indicated in FIG. 2. The pinch starts near the circumference of the electrodes and proceeds toward the center and the radiation spot is developed along the axis of symmetry and at the center of the inner electrode as shown in FIG. 2 at 34. Radiation can be collected and directed as described with respect to the FIG. 1 embodiment. However, it is possible to capture radiation in two directions coming out of both sides of the unit as shown in FIG. 2. Also, by locating a dielectric mirror at 38, a substantial percentage of the radiation initially reflected to the left could be reflected back through the radiation spot. This should stimulate radiation toward the right side.

Third Preferred Embodiment

A third preferred embodiment can be described by reference to FIG. 3. This embodiment is similar to the first preferred embodiment. In this embodiment, however, the buffer gas is argon. Helium has the desirable property that it is relatively transparent to 13 nm radiation, but it has the undesired property that it has a small atomic mass. The low atomic mass forces us to operate the system at a background pressure of 2–4 Torr. An additional drawback of the small atomic mass of He is the length of electrode required to match the acceleration distance with the timing of the electrical drive circuit. Because He is light, the electrode must be longer than desired so that the He falls off the end of the electrode simultaneous with the peak of current flow through the drive circuit.

A heavier atom such as Ar will have a lower transmission than He for a given pressure, but because of its higher mass can produce a stable pinch at a lower pressure. The lower operating pressure of Ar more than offsets the increased absorption properties of Ar. Additionally, the length of the electrode required is reduced due to the higher atomic mass. A shorter electrode is advantageous for two reasons. The first is a resulting reduction in circuit inductance when using a shorter electrode. A lower inductance makes the drive circuit more efficient and thus reduces the required electrical pump energy. The second advantage of a shorter electrode is a reduction in the thermal conduction path length from the tip of the electrode to the base. The majority of the thermal energy imparted to the electrode occurs at the tip and the conductive cooling of the electrode occurs mainly at the base (radiative cooling also occurs). A shorter electrode leads to a smaller temperature drop down its length from the hot tip to the cool base. Both the smaller pump energy per pulse and the improved cooling path allow the system to operate at a higher repetition rate. Increasing the repetition rate directly increases the average optical output power of the system. Scaling the output power by increasing repetition rate, as opposed to increasing the energy per pulse, is the most desired method for the average output power of lithography light sources.

In this preferred embodiment the lithium is not injected into the chamber in gaseous form as in the first and second embodiments. Instead solid lithium is placed in a hole in the center of the central electrode as shown in FIG. 3. The heat from the electrode then brings the lithium up to its evaporation temperature. By adjusting the height of the lithium relative to the hot tip of the electrode one can control the partial pressure of lithium near the tip of the electrode. One preferred method of doing this is shown in FIG. 3. A mechanism is provided for adjusting the tip of the solid lithium rod relative to the tip of the electrode. Preferably the system is arranged vertically so that the open side of coaxial electrodes 8 is the top so that any melted lithium will merely puddle near the top of the center electrode. The beam will exit straight up in a vertical direction as indicated in FIG. 5A. (An alternative approach is to heat the electrode to a temperature in excess of the lithium melting point so that the lithium is added as a liquid.) Extremely low flow pumps are available for pumping the liquid at rates needed for any specified repetition rates. A tungsten wick can be used to wick the liquid lithium to region of the central electrode tip.

The hole down the center of the electrode provides another important advantage. Since the plasma pinch forms near the center of the tip of the central electrode, much of the energy is dissipated in this region. Electrode material near this point will be ablated and eventually end up of other surfaces inside the pressure vessel. Employing an electrode with a central hole greatly reduces the available erosion material. In addition, Applicant's experiments have shown that the existence of lithium vapor in this region further reduces the erosion rate of electrode material. A bellows or other appropriate sealing method should be used to maintain a good seal where the electrode equipment enters the chamber. Replacement electrodes fully loaded with the solid lithium can be easily and cheaply manufactured and easily replaced in the chamber.

Small Vacuum Chamber Window

The pinch produces a very large amount of viable light which needs to be separated from the EUV light. Also, a window is desirable to provide additional assurance that lithography optics are not contaminated with lithium or tungsten. The extreme ultraviolet beam produced by the present invention is highly absorbed in solid matter. Therefore providing a window for the beam is a challenge. Applicants preferred window solution is to utilize an extremely thin foil which will transmit EUV and reflect visible. Applicants preferred window is a foil (about 0.2 to 0.5 micron) of beryllium tilted at an incident angle of about 10° with the axis of the incoming beam. With this arrangement, almost all of the visible light is reflected and about 50 to 80 percent of the EUV is transmitted. Such a thin window, of course, is not very strong. Therefore, Applicants use a very small diameter window and the beam is focused through the small window. Preferably the diameter of the thin beryllium window is about 10 mm. Heating of the little window must be considered, and for high repetition rates special cooling of the window will be needed.

In some designs this element can be designed merely as a beam splitter which will simplify the design since there will be no pressure differential across the thin optical element.

Figure 10:
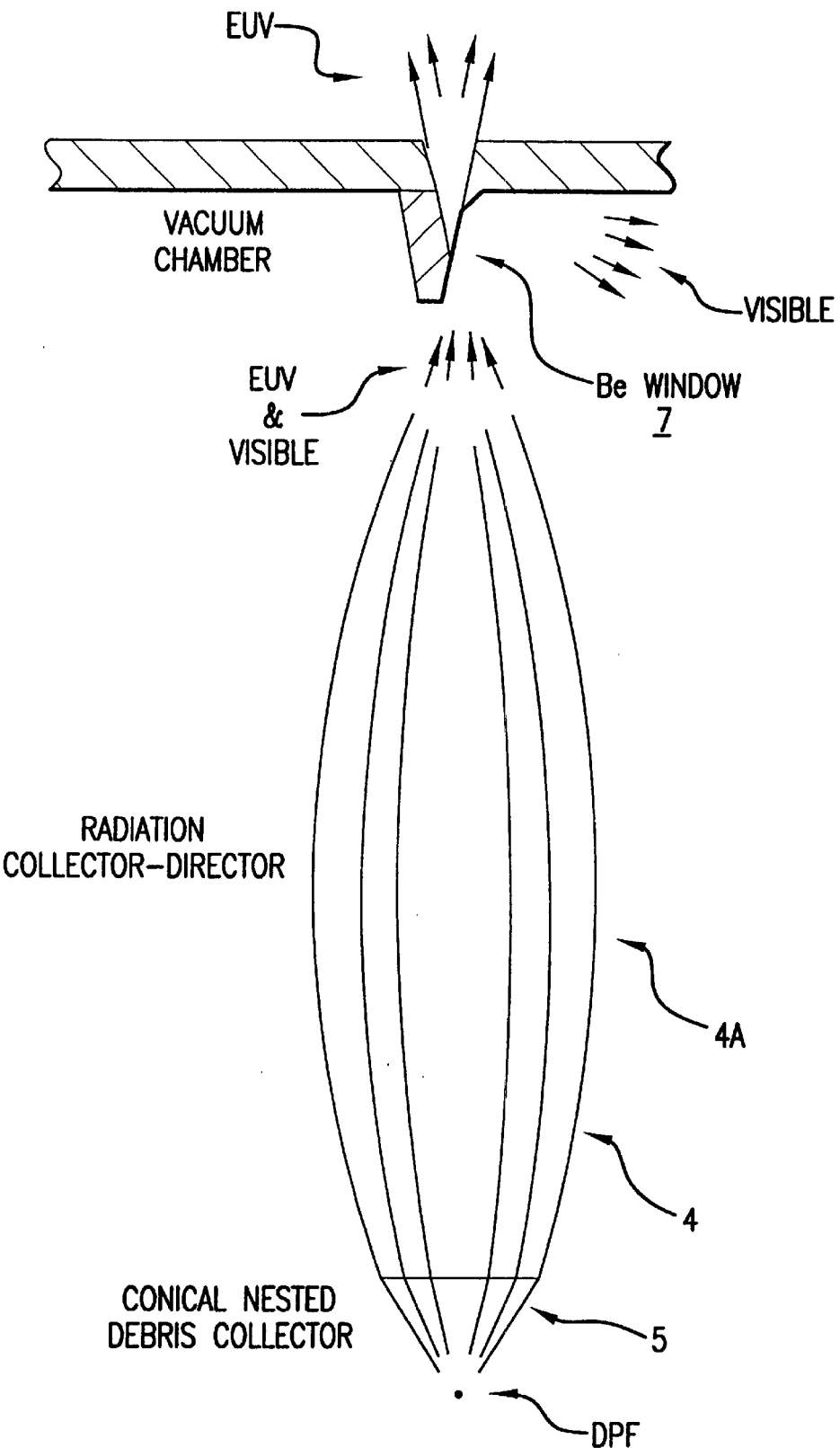
FIG. 10 shows thin Be window for reflecting visible light and transmitting EUV light.

FIG. 10 shows a preferred embodiment in which radiation collector 4 is extended by collector extension 4A to focus the beam 9 through 0.5 micron thick 1 mm diameter beryllium window 7.

Preionization

Applicants' experiments have shown that good results can be obtained without preionization but performance is improved with preionization. The prototype unit shown in FIG. 5 comprises DC driven spark gap preionizers to preionize the gas between the electrodes. Applicants will be able to greatly improve these energy stability values and improve other performance parameters with improved preionization techniques. Preionization is a well developed technique used by Applicants and others to improve performance in excimer lasers. Preferred preionization techniques include:

1) DC drive spark gap
2) RF driven spark gap
3) RF driven surface discharge
4) Corona discharge
5) Spiker circuit in combination with preionization These techniques are well described in scientific literature relating to excimer lasers and are well known.

Blast Shield

FIG. 5B shows the location of two of a total of eight spark plugs 138 providing preionization in a preferred embodiment. This figure also shows the cathode 111 and the anode 123 comprised of a stainless steel outer part and a tungsten inner part. Insulator shroud encircles the lower portion of anode 123 and a 5 mill thick film insulator 125 completes the isolation of the anode from the cathode. FIGS. 5B1–6 show the progression of a typical pulse leading to a pinch which is fully developed in FIG. 5B5 at about 1.2 μs after the initiation of the discharge.

During the discharge plasma is accelerated toward the tip of the anode by the Lorence forces acting on the ions and electrons created by the current flow through the plasma. Upon reaching the tip of the electrode shown at 121 in FIG. 5B force vectors directed radially compress and heat the plasma to high temperatures.

Once the plasma is compressed, the existing axially directed forces acting on the plasma tend to elongate the plasma column as shown especially in FIG. 5B6. It is this elongation that leads to instabilities. Once the plasma column has grown along the axis beyond a certain point, the voltage drop across the region of compressed plasma becomes too large to be sustained by the low pressure gas in the region around and near the tip of the anode. Arc-over occurs and much or all of the current flows through the shorter, lower density region of gas near the tip of the anode as shown by the dashed line in FIG. 5B6. This arc-over is detrimental because it produces instabilities in the pulse and causes relatively rapid electrode erosion.

A solution to this problem is to provide a physical barrier to motion of the plasma column in the axial direction. Such a barrier is shown as element number 143 in FIG. 5C and is called by Applicants a blast shield because it acts like a shield against the plasma exhaust of the PDF device. The blast shield must be made of an electrically insulating material with robust mechanical and thermal properties. In addition, the chemical compatibility of the blast shield material must be considered when operating with highly reactive elements such as Lithium. Lithium is a proposed emission element for this EUV source due to its intense emission at 13.5 nm. An excellent candidate is single crystal aluminum oxide, sapphire or an amorphous sapphire such as the trademarked material Lucalux manufactured by General Electric.

The optimum shape of the blast shield has been found to be a dome centered on the anode with a radius equal to the diameter of the anode as shown in FIG. 5C. Such a shape closely matches the naturally occurring plasma current lines when the plasma is under maximum compression. If the blast shield is placed further from the anode tip, then the plasma column will be too long leading to insufficient plasma heating and the risk of arc-over. If the blast shield is placed too close to the anode tip then current flow from the central axis out and down toward the cathode is restricted, again leading to insufficient plasma heating.

The hole in the top side of blast shield 143 at 144 is required to allow EUV radiation to escape and be collected for use. This hole must be made as small as possible due to the tendency of the plasma to leak out through this hole and form a long narrow column above the blast shield. A bevel cut into this hole as shown at 144 allows for greater off-axis collection of the EUV radiation produced by the plasma pinch device.

FIGS. 5C1-6 show how the blast shield contains the plasma pinch and prevents arc-over.

It is understood that the above described embodiments are illustrative of only a few of the many possible specific embodiments which can represent applications of the principals of the present invention. For example, instead of recirculating the working gas it may be preferable to merely trap the lithium and discharge the helium. Use of other electrode-coating combinations other than tungsten and silver are also possible. For example copper or platinum electrodes and coatings would be workable. Other techniques for generating the plasma pinch can be substituted for the specific embodiment described. Some of these other techniques are described in the patents referenced in the background section of this specification, and those descriptions are all incorporated by reference herein. Many methods of generating high frequency high voltage electrical pulses are available and can be utilized. An alternative would be to keep the lightpipe at room temperature and thus freeze out both the lithium and the tungsten as it attempts to travel down the length of the lightpipe. This freeze-out concept would further reduce the amount of debris which reached the optical components used in the lithography tool since the atoms would be permanently attached to the lightpipe walls upon impact. Deposition of electrode material onto the lithography tool optics can be prevented by designing the collector optic to re-image the radiation spot through a small orifice in the primary discharge chamber and use a differential pumping arrangement. Helium or argon can be supplied from the second chamber through the orifice into the first chamber. This scheme has been shown to be effective in preventing material deposition on the output windows of copper vapor lasers. Lithium hydride may be used in the place of lithium. The unit may also be operated as a static-fill system without the working gas flowing through the electrodes. Of course, a very wide range of repetition rates are possible from single pulses to about 5 pulses per second to several hundred or thousands of pulses per second. If desired, the adjustment mechanism for adjusting the position of the solid lithium could be modified so that the position of the tip of the central electrode is also adjustable to account for erosion of the tip.

Many other electrode arrangements are possible other than the ones described above. For example, the outside electrode could be cone shaped rather than cylindrical as shown with the larger diameter toward the pinch. Also, performance in some embodiments could be improved by allowing the inside electrode to pertrude beyond the end of the outside electrode. This could be done with spark plugs or other preionizers well known in the art. Another preferred alternative is to utilize for the outer electrode an array of rods arranged to form a generally cylindrical or conical shape. This approach helps maintain a symmetrical pinch centered along the electrode axis because of the resulting inductive ballasting.

Accordingly, the reader is requested to determine the scope of the invention by the appended claims and their legal equivalents, and not by the examples which have been given.

What is claimed is:

1. A high energy photon source comprising:
A. a vacuum chamber,
B. at least two electrodes located within said vacuum chamber and defining an electrical discharge region and arranged to create high frequency plasma pinches at a pinch site upon electrical discharge,
C. a working gas comprising an active gas and a buffer gas, said buffer gas being a noble gas, and said active gas being chosen to provide light at least one spectral line,
D. a working gas supply system for supplying a working gas to said discharge region,
E. a pulse power source for providing electrical pulses and voltages high enough to create electrical discharge between said at least one pair of electrode, and
F. a conical nested debris collector with surfaces aligned with light rays extending out from the pinch site toward the radiation collector-director.

2. A high energy photon source as in claim 1 wherein said pulse power source is programmable to provide electrical pulses at frequencies of at least 1000 Hz.

3. A high energy photon source as in claim 1 wherein said active gas is lithium vapor.

4. A high energy photon source as in claim 1 wherein said active gas is lithium hydride.

5. A high energy photon source as in claim 1 and further comprising a light pipe arranged to transmit radiation collected and directed by said collector-director.

6. A high energy photon source as in claim 1 wherein said buffer gas is argon.

7. A high energy photon source as in claim 1 wherein said buffer gas is radon.

8. A high energy photon source as in claim 1 wherein said at least two electrodes are three disk shaped electrodes defining two outer electrodes and an inner electrode, said two inner electrodes during operation being at a polarity opposite said inner electrode.

9. A high energy photon source as in claim 1 wherein said conical nested debris collector is fabricated as a part of said radiation collector-director.

10. A high energy photon source as in claim 9 wherein said material is lithium.

11. A high energy photon source as in claim 1 wherein said active gas is a vapor of a metal defining a melting point and further comprising a heating means to maintain said radiation collector and said debris collector at a temperature in excess of the melting point of said metal.

12. A high energy photon source as in claim 11 wherein said lithium is located in one of said two electrodes.

13. A high energy photon source as in claim 1 wherein said active gas is produced by heating of a material.

14. A high energy photon source as in claim 13 and further comprising a position adjustment means to adjust said lithium relative to said central electrode tip.

15. A high energy photon source as in claim 1 and further comprising a blast shield comprised of electrical insulator material positioned to limit elongation of said plasma pinches wherein said blast shield comprises a hole located so as to permit extreme ultraviolet light rays from said pinch to pass through said blast shield.

16. A high energy photon source as in claim 15 wherein said hole is beveled to permit increased off axis collection of the light rays.

17. A high energy photon source as in claim 1 wherein said two electrodes are configured coaxially to define a central electrode defining an axis and an outer electrode comprised of an array of rods.

18. A high energy photon source as in claim 17 wherein said array of rods are arranged to form in a generally cylindrical shape.

19. A high energy photon source as in claim 17 wherein said array of rods are arranged to form a generally conical shape.

20. A high energy source as in claim 1 and further comprising a beam splitter for transmitting extreme ultraviolet radiation and reflecting visible light.

21. A high energy source as in claim 20 wherein said window is comprised of a sheet of a solid material having a thickness of less than 1 micron.

22. A high energy source as in claim 20 wherein said material is chosen from a group of materials consisting of beryllium, zerconium and silicon.

23. A high energy source as in claim 1 and further comprising a preionizer for preionizing said working gas.

24. A high energy source as in claim 23 wherein said preionizer is a RF driven spark gap.

25. A high energy source as in claim 23 wherein said preionizer comprises a spiker circuit.

26. A high energy source as in claim 23 wherein said preionizer is a DC spark gap ionizer.

27. A high energy source as in claim 26 wherein said preionizer is a RF driven surface discharge.

28. A high energy source as in claim 26 wherein said preionizer is a corona discharge.

29. A high energy source as in claim 1 and further comprising a vacuum chamber window for transmitting extreme ultraviolet radiation and reflecting visible light.

30. A high energy source as in claim 29 wherein said window is comprised of a sheet of a solid material having a thickness of less than 1 micron.

31. A high energy source as in claim 29 wherein said material is chosen from a group of materials consisting of beryllium and silicon.

32. A high energy photon source as in claim 29 and further comprising a focusing means for focusing said radiation on to said windows.

33. A high energy photon source as in claim 1 and further comprising an external reflection radiation collector-director for collecting radiation produced in said plasma pinches and for directing said radiation in a desired direction.

34. A high energy photon source as in claim 33 wherein said metal is lithium.

35. A high energy photon source as in claim 34 wherein said two electrodes are configured coaxially to define a central electrode defining an axis and a central tip and said lithium is positioned along said axis.

36. A high energy photon source as in claim 33 wherein said electrodes are comprised of an electrode material and said collector-director is coated with the same electrode material.

37. A high energy photon source as in claim 36 wherein said buffer gas is helium.

38. A high energy photon source as in claim 36 wherein said electrode material is tungsten.

39. A high energy photon source as in claim 38 wherein said electrode material is silver.

* * * * *